United States Patent
Kim et al.

(10) Patent No.: US 10,848,133 B2
(45) Date of Patent: Nov. 24, 2020

(54) LOW POWER RC OSCILLATOR WITH SWITCHED BIAS CURRENT

(71) Applicants: SAMSUNG ELECTRONICS CO., LTD., Suwon-si (KR); Research & Business Foundation SUNGKYUNKWAN UNIVERSITY, Suwon-si (KR)

(72) Inventors: Jonghan Kim, Seoul (KR); Chisung Bae, Yongin-si (KR); Jaemin Choi, Suwon-si (KR); Yoonmyung Lee, Seongnam-si (KR); Jung-Hoon Chun, Seoul (KR)

(73) Assignees: Samsung Electronics Co., Ltd., Suwon-si (KR); Research & Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/268,676

(22) Filed: Feb. 6, 2019

(65) Prior Publication Data
US 2019/0386615 A1    Dec. 19, 2019

(30) Foreign Application Priority Data
Jun. 15, 2018 (KR) .................. 10-2018-0068601

(51) Int. Cl.
*H03K 3/0231* (2006.01)

(52) U.S. Cl.
CPC ... *H03K 3/0231* (2013.01); *H03B 2200/0082* (2013.01)

(58) Field of Classification Search
CPC ............. H03B 5/24; H03B 2200/0082; H03K 3/0231; H03K 4/12; H03K 4/50
USPC .................................. 331/111, 143
See application file for complete search history.

(56) References Cited

U.S. PATENT DOCUMENTS

| | | | | |
|---|---|---|---|---|
| 5,699,024 A * | 12/1997 | Manlove | ............... | H03K 3/0231 331/111 |
| 5,870,000 A * | 2/1999 | Matsuda | ............... | H03K 3/0231 331/111 |
| 6,137,373 A * | 10/2000 | Mori | ..................... | H03K 3/0231 331/145 |
| 8,063,710 B2 * | 11/2011 | Shikata | ..................... | H03L 1/00 331/111 |
| 8,878,621 B2 * | 11/2014 | Matsuzaki | ............... | G05F 1/567 327/512 |
| 2005/0253636 A1 * | 11/2005 | Yang | .................. | H02M 3/33507 327/172 |
| 2008/0218283 A1 * | 9/2008 | Deguchi | ............... | H03K 3/0231 331/111 |
| 2009/0302954 A1 * | 12/2009 | Chen | ..................... | H03K 3/011 331/66 |

(Continued)

FOREIGN PATENT DOCUMENTS

JP    2016-116155 A    6/2016
KR    10-0744912 B1    8/2007

*Primary Examiner* — Levi Gannon
(74) *Attorney, Agent, or Firm* — NSIP Law

(57) ABSTRACT

An oscillator includes a constant current generator configured to generate a constant current by maintaining a predetermined potential difference between both a first end and a second end of a resistor, and an oscillating element configured to output a clock signal corresponding to a charge and discharge cycle of a capacitor based on a bias current corresponding to the constant current.

20 Claims, 13 Drawing Sheets

(56) References Cited

U.S. PATENT DOCUMENTS

| | | | | |
|---|---|---|---|---|
| 2010/0013566 A1* | 1/2010 | Kim | ........................ | H03K 4/502 331/111 |
| 2012/0249114 A1* | 10/2012 | Sako | ........................ | G05F 1/561 323/312 |
| 2012/0319793 A1* | 12/2012 | Iwasa | ........................ | H03K 3/011 331/176 |
| 2013/0038364 A1* | 2/2013 | Tokairin | ................... | H03K 4/502 327/156 |
| 2014/0062610 A1* | 3/2014 | Ito | ........................ | H03K 3/0231 331/186 |

* cited by examiner

LOW POWER RC OSCILLATOR WITH SWITCHED BIAS CURRENT

CROSS-REFERENCE TO RELATED APPLICATIONS

This application claims the benefit under 35 USC § 119(a) of Korean Patent Application No. 10-2018-0068601 filed on Jun. 15, 2018 in the Korean Intellectual Property Office, the entire disclosure of which is incorporated herein by reference for all purposes.

BACKGROUND

1. Field

This application relates to an oscillator, for example, a low-power RC oscillator.

2. Description of Related Art

A clock cycle of an RC oscillator is determined principally by RC comprised of a resistance R and a capacitance C, and thus an output frequency may be controlled by adjusting values of the resistance and the capacitance. The resistance and the capacitance are values insensitive to a change in power source and compensate for a change in temperature.

However, a delay time $T_D$ by a comparator and a buffer included in the RC oscillator relies on the changes in temperature and the power source, and is affected by noise occurring at a gate of the comparator. Since the delay time of the comparator and the buffer is an uncontrollable value, the delay time should be short and constant to achieve a stable frequency characteristic. To reduce an effect of the delay time on frequency determination of the RC oscillator, a comparator having a relatively high bandwidth may be necessary, which may lead to an increase in power consumption.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an oscillator includes a constant current generator configured to generate a constant current by maintaining a predetermined potential difference between a first end of a resistor of the constant current generator and a second end of the resistor; and an oscillating element configured to output a clock signal corresponding to a charge and discharge cycle of one or more of a first capacitor and a second capacitor of the oscillating element based on a bias current corresponding to the generated constant current.

The constant current generator may include the resistor and a feedback loop configured to maintain a voltage to be applied to the resistor to be a first reference voltage.

The feedback loop may include an amplifier configured to receive the first reference voltage and a voltage to be applied to the first end of the resistor, and a transistor configured to receive an output of the amplifier as a gate voltage and control the voltage to be applied to the first end of the resistor.

The resistor may include a first resistor which has a positive temperature coefficient, and a second resistor which has a negative temperature coefficient, wherein the first resistor and the second resistor are variable resistors.

The constant current may be scaled by adjusting magnitudes of the first resistor and magnitudes of the second resistor, and a temperature-dependent characteristic of a frequency of the clock signal may be compensated for based on a ratio of the first resistor to the second resistor.

Magnitudes of the first resistor and magnitudes of the second resistor and a ratio of the first resistor to the second resistor may be controlled through operation of switches respectively connected in parallel with the first resistor and the second resistor.

The constant current generator may further include a capacitor connected between an output end of the amplifier and a source of the transistor.

The constant current generator may further include a capacitor connected between an output end of the amplifier and a drain of the transistor.

The oscillator may further include a mirroring element configured to mirror the generated constant current, wherein the bias current is generated based on the mirrored constant current.

The clock signal may include a first signal and a second signal which have exclusive logical values.

The oscillating element may include the capacitor, and a comparator configured to compare a voltage of the capacitor to a reference voltage.

The oscillator may further include a mirroring element configured to mirror the generated constant current, wherein the comparator may be configured to operate based on the mirrored constant current.

The oscillating element may further include a switch element configured to control the charge and discharge cycle of the capacitor based on the clock signal.

The constant current generator may further include an initial bias supply circuit configured to supply an initial bias current to operate an amplifier included in the feedback loop.

The initial bias supply circuit includes a first mirroring circuit configured to mirror the generated constant current, a second mirroring circuit configured to mirror the mirrored constant current, and a control circuit configured to generate a current path between the first mirroring circuit and the second mirroring circuit such that the initial bias current is generated by the second mirroring circuit until the feedback loop reaches a steady state.

The clock signal may include a first signal and a second signal which have exclusive logical values, and the oscillating element may include the first capacitor, which is configured to be charged based on the second signal, the second capacitor, which is configured to be charged based on the first signal, a first comparator configured to compare a voltage of the first capacitor to a reference voltage, and a second comparator configured to compare a voltage of the second capacitor to the reference voltage.

The oscillating element may further include a feedback circuit configured to control the reference voltage such that a mean of the voltage of the first capacitor and the voltage of the second capacitor is constant.

The oscillator may further include a latch, wherein the latch includes a set input end connected to an output end of the first comparator, a reset input end connected to an output end of the second comparator, a positive output end configured to output the first signal, and a negative output end configured to output the second signal.

The feedback circuit may include a feedback amplifier configured to receive one of the voltage of the first capacitor and the voltage of the second capacitor as a first input through a feedback resistor, wherein the one of the voltage of the first capacitor and the voltage of the second capacitor is selected based on the clock signal, and the feedback amplifier is further configured to receive a constant voltage to control the reference voltage as a second input, and a feedback capacitor connected between the first input and an output of the feedback amplifier.

The oscillator may further include a first transistor configured to supply an operating current to the first comparator, a second transistor configured to supply an operating current to the second comparator, and a third transistor configured to additionally supply an operating current to one of the first comparator and the second comparator, based on the clock signal.

In a general aspect, a method includes generating a constant current by maintaining a predetermined potential difference between a first end of a resistor of a constant current generator and a second end of the resistor and outputting a clock signal corresponding to a charge and discharge cycle of a capacitor of an oscillating element based on a bias current corresponding to the generated constant current.

In another general aspect, an oscillator includes a constant current generator configured to generate a constant current in a resistor based on a feedback loop, and an oscillating element configured to charge a capacitor of the oscillating element by mirroring the generated constant current, and generate a clock signal by comparing a voltage of the charged capacitor and a reference voltage.

The oscillator may further include a control circuit configured to control a charge and discharge of the capacitor based on the clock signal.

Other features and aspects will be apparent from the following detailed description, the drawings, and the claims.

Figure 1:
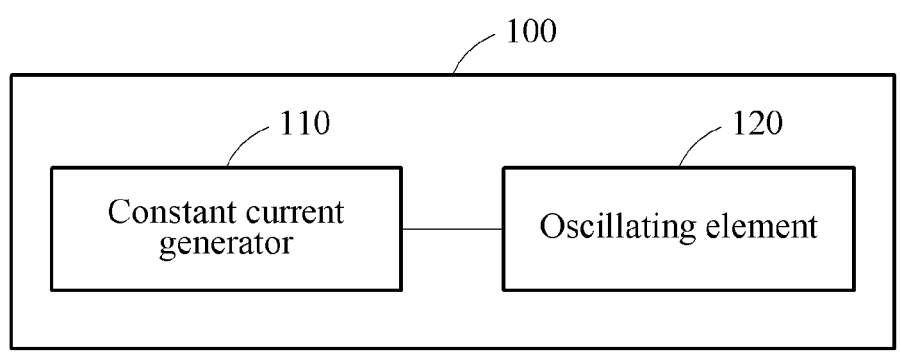
FIG. 1 illustrates an example of an oscillator.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first" or "second" may be used to explain various components, the components are not limited to the terms. Each of these terminologies is not used to define an essence, order, or sequence of a corresponding component but may be used merely to distinguish the corresponding component from other component(s). For example, a "first" component may be referred to as a "second" component, or similarly, and the "second" component may be referred to as the "first" component within the scope of the right according to the concept of the examples.

It should be noted that if it is described that one component is "connected", "coupled", or "joined" to another component, a third component may be "connected", "coupled", and "joined" between the first and second components, although the first component may be directly connected, coupled, or joined to the second component. On the contrary, it should be noted that if it is described that one component is "directly connected", "directly coupled", or "directly joined" to another component, a third component may be absent. Expressions describing a relationship between components, for example, "between", directly between", or "directly neighboring", etc., should be interpreted to be alike.

The terminology used herein is for the purpose of describing particular embodiments only and is not intended to be limiting. For example, as used herein, the singular forms "a," "an," and "the," are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Also, in the description of example embodiments, detailed description of structures or functions that are thereby known after an understanding of the disclosure of the present application will be omitted when it is deemed that such description will cause ambiguous interpretation of the example embodiments.

Hereinafter, the examples will be described in detail with reference to the accompanying drawings, wherein like drawing reference numerals are used for like elements.

FIG. 1 illustrates an example of an oscillator 100.

Referring to FIG. 1, the oscillator 100 includes a constant current generator 110 and an oscillating element 120. The oscillator 100 may generate a clock signal. The clock signal is a square-wave signal which periodically shows a logical state high H (logic "1") and a logical state low L (logic "0"). The oscillator 100 includes an RC oscillator. The RC oscillator is integrated in a chip and may consume less power than an oscillator of a different structure.

The use of the term "may" herein with respect to an example or embodiment, e.g., as to what an example or embodiment may include or implement, means that at least one example or embodiment exists where such a feature is included or implemented while all examples and embodiments are not limited thereto.

The oscillating element 120 may include various devices to generate the clock signal, for example, a capacitor and a comparator. However, the devices are not limited thereto. The oscillating element 120 periodically charges and discharges the capacitor based on the clock signal, and generates the clock signal by comparing a voltage of the capacitor to a reference voltage using the comparator.

To operate the device included in the oscillating element 120, for example, the comparator, a bias current should be supplied. A general RC oscillator receives a bias current separately from an off-chip device.

The oscillator 100 includes the constant current generator 110 that supplies a bias current to the oscillating element 120. The constant current generator 110 generates a constant current. An ideal constant current is a time-invariant current that flows in a node being used. The constant current generated by the constant current generator 110 is used as a self-bias current of the devices used in the oscillator 100 including the oscillating element 120. The oscillator 100 uses the constant current generated by the constant current generator 110 as the self-bias current, and thus there is no need to configure a separate circuit on the off-chip device to supply the bias current to the comparator.

Figure 2A:
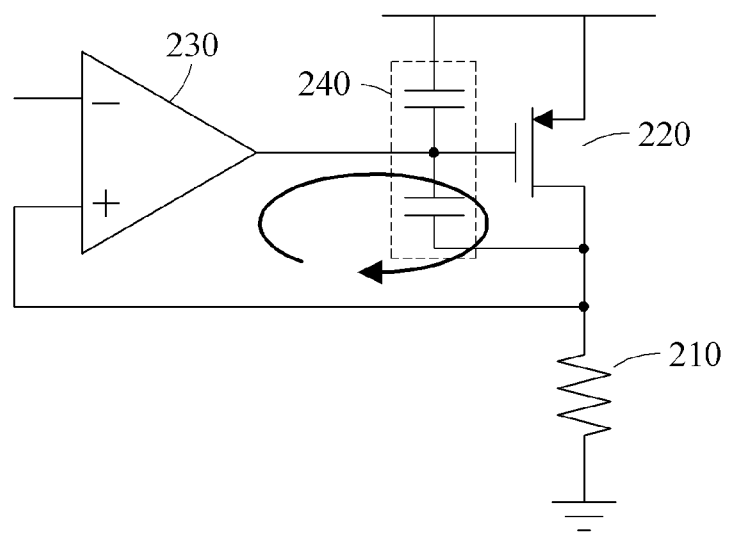
FIG. 2A illustrates an example of a constant current generator using a p-channel metal oxide semiconductor (PMOS)

FIG. 2A illustrates an example of a constant current generator using a p-channel metal oxide semiconductor (PMOS).

Referring to FIG. 2A, a constant current generator generates a bias current by itself based on an operating power source. The constant current generator includes a resistor 210, an amplifier 230, and a transistor 220. The constant current generator generates a constant current by maintaining a predetermined potential difference between both ends of the resistor 210 using the amplifier 230 and the transistor 220.

The amplifier 230 receives a first reference voltage as a first input, and a voltage to be applied to a first end of the resistor 210 as a second input. The transistor 220 receives an output of the amplifier 230 as a gate voltage and controls the voltage to be applied to the first end of the resistor 210. For example, the first reference voltage is a constant voltage of a predetermined magnitude generated by dividing an operating power source, and the transistor is a PMOS. A source of the transistor is connected to the operating power source.

The predetermined potential difference between the ends of the resistor 210 is maintained through a feedback loop. The feedback loop is a loop including the amplifier 230 and the transistor 220, in detail, a positive feedback loop that starts from an output end of the amplifier 230, goes through a gate and a drain of the transistor 220 and returns to an input end of a positive terminal of the amplifier 230 again.

The constant current generator maintains the voltage to be applied to the resistor 210 to be the first reference voltage through the feedback loop. The transistor 220 of the feedback loop operates as an amplifier and obtains a gain. An overall gain of the feedback loop is determined based on a product of a gain of the amplifier 230 and the gain of the transistor 220. In response to an increase in the overall gain of the feedback loop, magnitudes of the two input voltages of the amplifier 230, for example, a magnitude of the first reference voltage and a magnitude of the voltage to be applied to the resistor 210 may be substantially equalized. For example, if the overall gain of the feedback loop is 80 decibels (dB), the magnitude of the voltage to be applied to the resistor 210 of the amplifier 230 is controlled to have a difference of less than 1 millivolt (mV) from the magnitude of the first reference voltage.

When the first reference voltage which is the constant voltage is applied to the resistor 210 through the feedback loop, a constant-current flow in the resistor 210. For example, if the magnitude of the first reference voltage is $V_{ref1}$ volts (V), and a magnitude of the resistor 210 is R1 ohms (Ω), a voltage of the magnitude $V_{ref1}$ V is applied to the resistor 210 through the feedback loop. When the voltage of $V_{ref1}$ V which is a constant voltage is applied to the resistor 210, a constant current of $V_{ref1}$/R1 amperes (A) flows in the resistor 210.

The constant current generated by the constant current generator is copied through a mirroring circuit and used as a bias current in the oscillator, which will be described further later.

The constant current generator further includes a capacitor element 240 including a capacitor connected between the output end of the amplifier and the source of the transistor, a capacitor connected between the output end of the amplifier and the drain of the transistor, and a combination thereof. By adding the capacitor element 240, a stability issue occurring at the feedback loop is prevented. For example, by adding a capacitor between the output end of the amplifier 230 and the source of the transistor 220, a phase margin of the feedback loop is assured. By adding a capacitor between the output end of the amplifier 230 and the drain of the transistor 220, the capacitance is amplified according to the Miller effect, which is advantageous in terms of area.

Figure 2B:
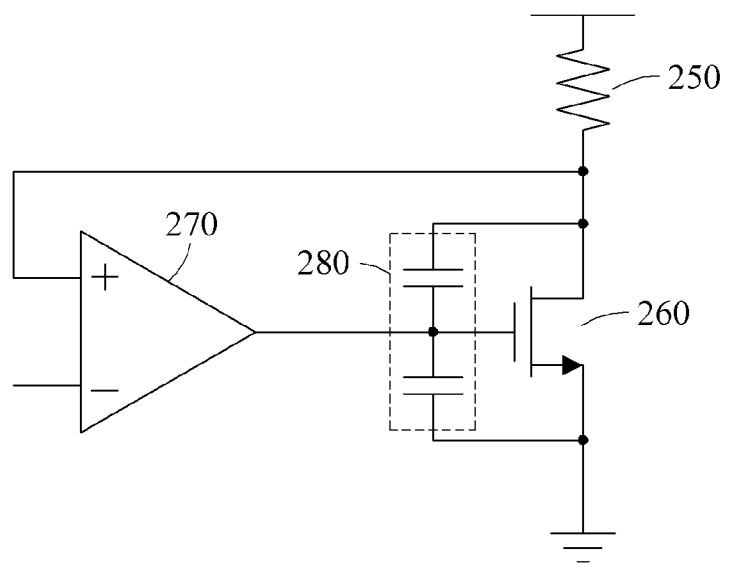
FIG. 2B illustrates an example of a constant current generator using an n-channel metal oxide semiconductor (NMOS)

FIG. 2B illustrates an example of a constant current generator using an n-channel metal oxide semiconductor (NMOS).

Referring to FIG. 2B, a constant current generator includes a resistor 250, an amplifier 270, and a transistor 260. Unlike the example of FIG. 2A, the transistor 260 is an NMOS. A source of the transistor 260 is connected to a ground GND, and a first end of the resistor 250 is connected to an operating power source. The constant current generator further includes a capacitor element 280 including a capacitor connected between the output end of the amplifier and the source of the transistor, a capacitor connected between the output end of the amplifier and the drain of the transistor. An operation of the constant current generator of FIG. 2B corresponds to an operation of the constant current generator of FIG. 2A, and thus duplicate description will be omitted here.

Figure 3:
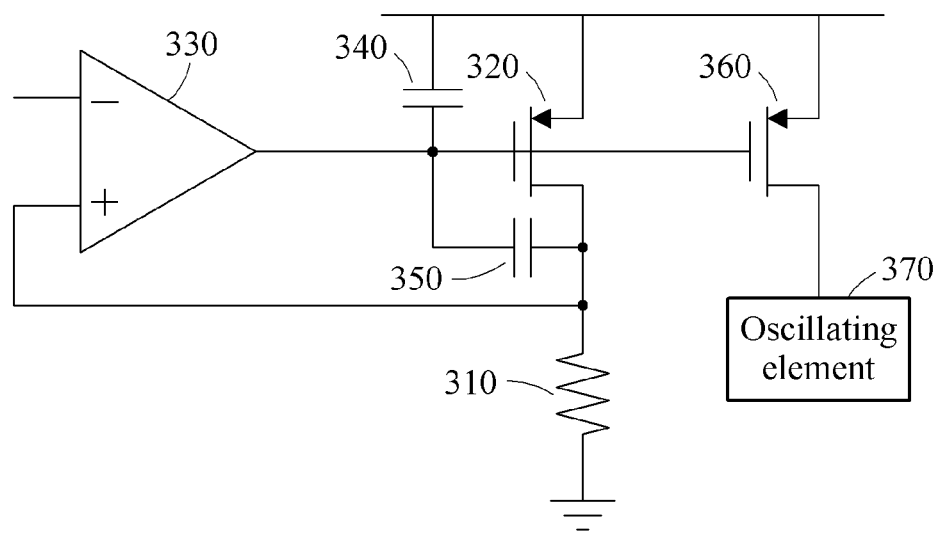
FIG. 3 illustrates an example of current mirroring.

FIG. 3 illustrates an example of current mirroring.

Referring to FIG. 3, an oscillator includes a current generator, a mirroring element 360, and an oscillating element 370. The current generator includes a resistor 310, an amplifier 330, and a transistor 320. The current generator further includes a first capacitor 340 and a second capacitor 350. The current generator of FIG. 3 corresponds to the current generator of FIG. 2A, and thus duplicate description will be omitted here.

The mirroring element 360 mirrors a current that flows in the resistor 310 and supplies the mirrored current to the oscillating element 370. A gate of the transistor 320 of the current generator is connected to a gate of a mirroring transistor of the mirroring element 360. Further, the transistor 320 of the current generator and the mirroring transistor of the mirroring element 360 use a common source. The mirroring transistor of the mirroring element 360 mirrors the current that flows in the resistor 310 of the current generator and provides the mirrored current to the oscillating element 370.

The mirroring element 360 is a circuit designed to copy a current through a single active device by controlling a current of another active device of the circuit and maintain a predetermined output current regardless of a load. A current that flows in a first transistor is copied through current mirroring such that the same current flows in another transistor. A current mirroring circuit is implemented using a metal oxide semiconductor field effect transistor (MOSFET) or a bipolar junction transistor (BJT). For example, if a base current is fixed to a predetermined value, a practically constant collector current flows in the BJT operating in a linear region regardless of a change in VCE voltage, and thus may be used as a constant current source in a limited voltage range. Further, in an example of the MOSFET, if a gate voltage is fixed to a predetermined value, a substantially constant drain current flows in the MOSFET operating in a saturation region regardless of a change in VDS voltage, and thus may also be used as the constant current source in the limited voltage range.

When the transistor 320 of the current generator and the mirroring transistor of the mirroring element 360 have the same gate-source voltages and are matched, the same current flows in the drains of the two transistors. For example, by equalizing a gate voltage of the transistor 320 to supply the current to flow in the resistor 310 of the current generator and a gate voltage of the mirroring transistor of the mirroring element 360, the current that flows in the resistor 310 is mirrored as the drain current of the mirroring transistor of the mirroring element 360.

In an example, by changing a magnitude of the constant current generated by the constant current generator through scaling of the mirroring transistor, the constant current is mirrored to a current of the same magnitude of the constant current generated by the constant current generator, or a current of a desired magnitude. The oscillating element 370 uses the received constant current as a bias current to operate devices such as a comparator and an amplifier in the oscillating element 370, or uses the received constant current to charge the capacitor in the oscillating element 370.

Figure 4A:
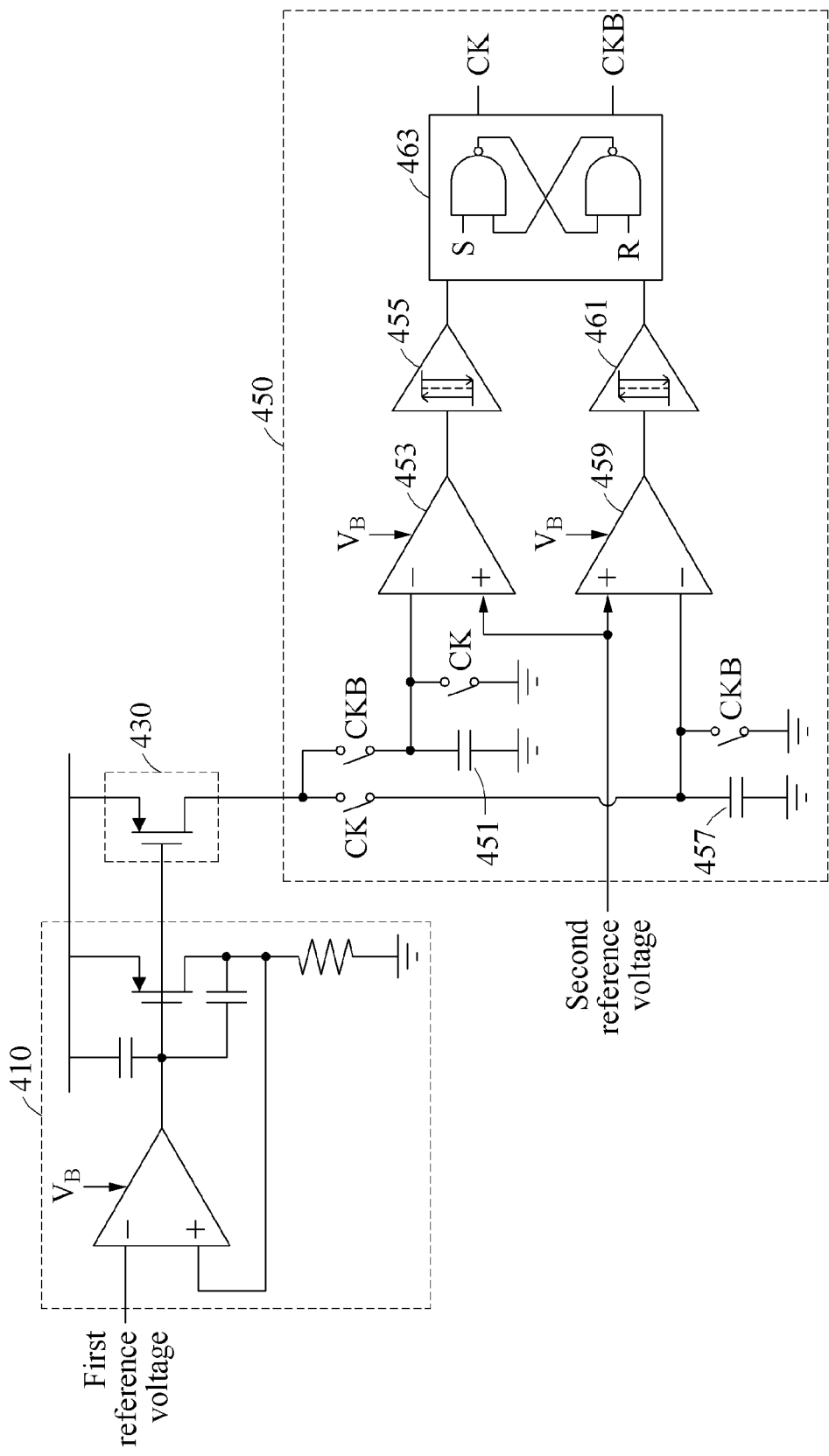
FIG. 4A illustrates an example of an oscillator including a current generator and a relaxation oscillating element.

FIG. 4A illustrates an example of an oscillator including a current generator and a relaxation oscillating element.

Referring to FIG. 4A, an oscillator includes a current generator 410, a mirroring transistor 430, and a relaxation oscillating element 450.

The current generator 410 and the mirroring transistor 430 respectively correspond to the current generator of FIG. 2A and the mirroring transistor of FIG. 3, and thus a duplicate description will be omitted here.

The relaxation oscillating element 450 includes two capacitors 451 and 457, two comparators 453 and 459, and a latch 463. The first comparator 453 compares a voltage of the first capacitor 451 to a second reference voltage. The second comparator 459 compares a voltage of the second capacitor 457 to the second reference voltage. An output end of the first comparator 453 is connected to a set (S) input end of the latch 463, and an output end of the second comparator 459 is connected to a reset (R) input end of the latch 463.

An output of the latch is used as a clock signal. The clock signal includes a first signal and a second signal having exclusive logical values. A positive output end of the latch 463 outputs the first signal, and a negative output end of the latch 463 outputs the second signal. The first signal and the second signal of the clock signal each are a square-wave signal which periodically shows a logical state high H (logic "1") and a logical state low L (logic "0").

Charge and discharge cycles of the capacitors 451 and 457 may be determined based on the clock signal. The relaxation oscillating element 450 selectively charges and discharges the two capacitors 451 and 457 using switches controlled based on the clock signal. In response to the capacitors being charged or discharged, values output from the comparators change, and an output of the latch 463 periodically varies based on the values output from the comparators, whereby the clock signal is generated.

For example, when the logical state of the first signal is "1", a voltage of 0 V is applied to both ends of the first capacitor 451, and a current mirrored from the constant current generated by the current generator flows in the second capacitor 457. Since the current flows at both ends of the second capacitor 457, the second capacitor 457 is charged. If a voltage applied to the ends of the second capacitor 457 is less than the second reference voltage, the logical state of the set input end of the latch 463 is "1", and the logical state of the reset input end of the latch 463 is "1". If the second capacitor 457 is charged such that the voltage applied to the ends of the second capacitor 457 becomes greater than the second reference voltage, a logical value of the reset input end of the latch 463 is changed to "0". In response to the change in the logical value of the reset input end of the latch 463, the logical state of the first signal is changed to "0".

If the logical state of the first signal is "0", a current mirrored from the constant current generated by the current generator flows in the first capacitor 451, and a voltage of 0 V is applied to the ends of the second capacitor 457. Since the current flows at both ends of the first capacitor 451, the first capacitor 451 is charged. If a voltage applied to the ends of the first capacitor 451 is less than the second reference voltage, the logical state of the set input end of the latch 463 is "1", and the logical state of the reset input end of the latch 463 is "1". If the logical state of the set input end of the latch 463 is "1", and the logical state of the reset input end of the latch 463 is "1", the latch 463 maintains the previous state, and thus the first signal is still "0". If the first capacitor 451 is charged such that the voltage applied to the ends of the first capacitor 451 becomes greater than the second reference voltage, the logical value of the set input end of the latch 463 is changed to "0". In response to the change in the logical value of the reset input end of the latch 463, the logical state of the first signal is changed to "1".

If the logical state of the first signal is changed to "1", the above process is performed repeatedly. Accordingly, the clock signal having a cycle with repetition of the logical states of "1" and "0" is generated. Although FIG. 4A is described based on an SR NAND latch, the oscillating element 450 may also be implemented using other latches including an SR NOR latch.

The oscillating element 450 may further include a first Schmitt trigger 455 that receives an output of the first comparator 453 as an input, and a second Schmitt trigger 461 that receives an output of the second comparator 459 as an input. A Schmitt trigger converts an analog signal into a digital signal. For example, the output of the first comparator 453 is an analog signal which changes with continuity. When the output of the first comparator 453 passes through the first Schmitt trigger 455, a noise component is removed such that the output of the first comparator 453 is corrected to a form more suitable for an input of the SR latch 463. The second Schmitt trigger 461 also functions in the same manner.

A bias current to be provided to the first comparator 453 and the second comparator 459 is generated by mirroring the constant current generated by the current generator 410, which will be described further later. As described above, an amount of the bias current is controlled based on scaling of the mirroring transistor.

Figure 4B:
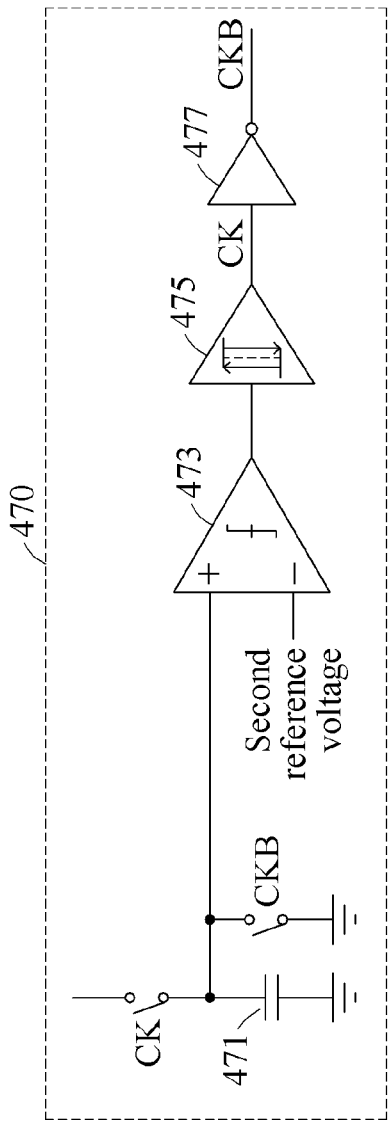
FIG. 4B illustrates an example of an oscillating element using a single comparator.

FIG. 4B illustrates an example of an oscillating element which uses a single comparator.

Referring to FIG. 4B, an oscillating element 470 includes a capacitor 471, a comparator 473, and an inverter 477. The oscillating element 470 further includes a Schmitt trigger 475. The capacitor 471 may be charged with a mirrored current, and the comparator 473 may compare a voltage of the capacitor 471 to a second reference voltage. If the voltage of the capacitor 471 is less than the second reference voltage, the comparator 473 outputs a signal having a first logical value. If the voltage of the capacitor 471 is greater than the second reference voltage, the comparator 473 outputs a signal having a second logical value. A periodic clock signal may be generated based on an output signal of the comparator 473.

Figure 5A:
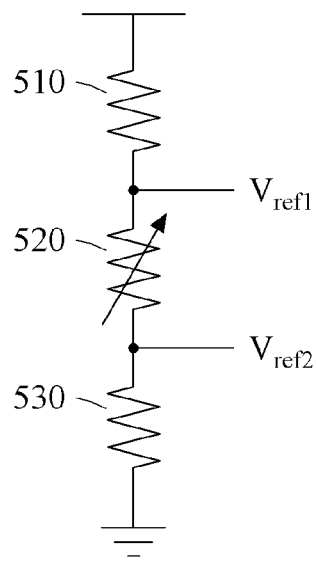
FIG. 5A illustrates an example of a frequency-controllable reference voltage dividing circuit.

FIG. 5A illustrates an example of a frequency-controllable reference voltage dividing circuit.

Referring to FIG. 5A, a first reference voltage $V_{ref1}$ used by a current generator and a second reference voltage $V_{ref2}$ used by an oscillating element are divided from a single voltage source. The frequency-controllable reference voltage dividing circuit as illustrated in FIG. 5A includes a resistor R1 510, a resistor R3 530, and a resistor R2 520 which is a variable resistor connected between resistor R1 510 and resistor R3 530. Depending on a value of the variable resistor R2 520, the first reference voltage and the second reference voltage may be identical to, or different from, each other.

For example, if V denotes a magnitude of a voltage source, $V_{ref1}$ is $$\frac{(R2+R3)}{R1+R2+R3}V,$$

and $V_{ref2}$ is $$\frac{(R2+R3)}{R1+R2+R3}V.$$

Since R2 520 is a variable resistor, magnitudes of the first reference voltage and the second reference voltage may be adjusted by adjusting a value of R2.

By adjusting the magnitudes of the reference voltages, a frequency of the clock signal may be controlled. For example, when the magnitude of the resistor R2 520 decreases, a magnitude of the second reference voltage increases. In response to the increase in the magnitude of the second reference voltage, a charging time of a capacitor increases and thus, the frequency of the clock signal decreases.

Conversely, when the magnitude of the second reference voltage decreases by increasing the magnitude of the resistor R2 520, the charging time of the capacitor decreases and thus, the frequency of the clock signal increases.

In another example, when the magnitude of the first reference voltage increases, an amount of a constant current to be generated by a current generator increases, and thus the charging time of the capacitor decreases, and the frequency of the clock signal increases. When the magnitude of the first reference voltage decreases, the charging time of the capacitor increases, and thus the frequency of the clock signal decreases.

Figure 5B:
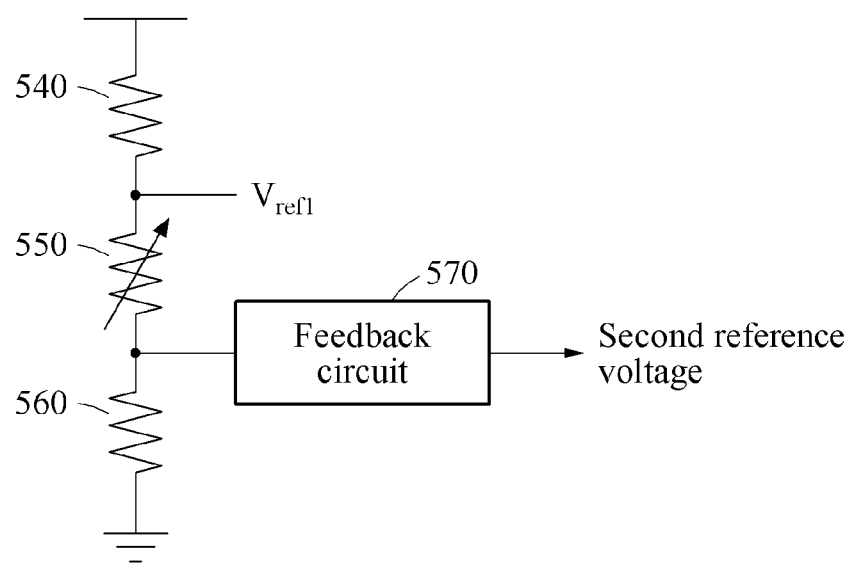
FIG. 5B illustrates an example of a reference voltage dividing circuit including a feedback circuit.

FIG. 5B illustrates an example of a reference voltage dividing circuit including a feedback circuit.

Referring to FIG. 5B, a reference voltage dividing circuit includes a resistor R4 540, a resistor R6 560, a variable resistor R5 550, and a feedback circuit 570. The feedback circuit 570 dynamically controls a second reference voltage to be applied to a comparator of an oscillating element, to stabilize a frequency characteristic of a clock signal to be output by the oscillating element.

Prior to describing an operation of the feedback circuit 570, the frequency characteristic of the clock signal will be briefly described.

Referring to FIG. 4A, a cycle of the clock signal is determined based on the reference voltage and the voltage applied to both ends of the capacitor. The second reference voltage is a voltage of a predetermined magnitude determined by a user. When $V_{c1,2}(t)$ denotes a voltage applied to both ends of the first capacitor 451 and the second capacitor 457, $V_{ref1}$ denotes the first reference voltage, R denotes a resistor of the current generator, and C denotes magnitudes of the first capacitor and the second capacitor, the voltage applied to the ends of the first capacitor 451 and the second capacitor 457 is expressed by Equation 1.

$$V_{c1,2}(t) = \frac{1}{C}\int k\frac{V_{ref1}}{R}dt = k\frac{V_{ref1}}{RC}t \qquad \text{Equation 1}$$

In Equation 1, k denotes a copy ratio. In an ideal example, the cycle of the clock signal is determined based on a time required until magnitudes of the second reference voltage and $V_{c1,2}(t)$ are equalized.

The cycle of the clock signal in an environment where a circuit operates in reality is determined by adding a delay time of the comparator, the amplifier and the buffer to the ideal cycle of the clock signal. The delay time by the comparator, the amplifier and the buffer relies on changes in temperature and supplied power source, and is affected by noise occurring at a gate of the comparator. Since the delay time of the comparator, the amplifier, and the buffer is an uncontrollable value, the delay time should be short and constant to in order to achieve a stable frequency characteristic. When a feedback circuit is used, the delay time is compensated for, such that a predetermined frequency is maintained.

The feedback circuit 570 receives a voltage applied to the resistor R6 560 as an input. Although not shown in the drawings, the feedback circuit 570 may further receive a voltage of the capacitor of the oscillating element as an input. Hereinafter, an operation of the feedback circuit 570 will be described in detail with reference to FIG. 6.

Figure 6:
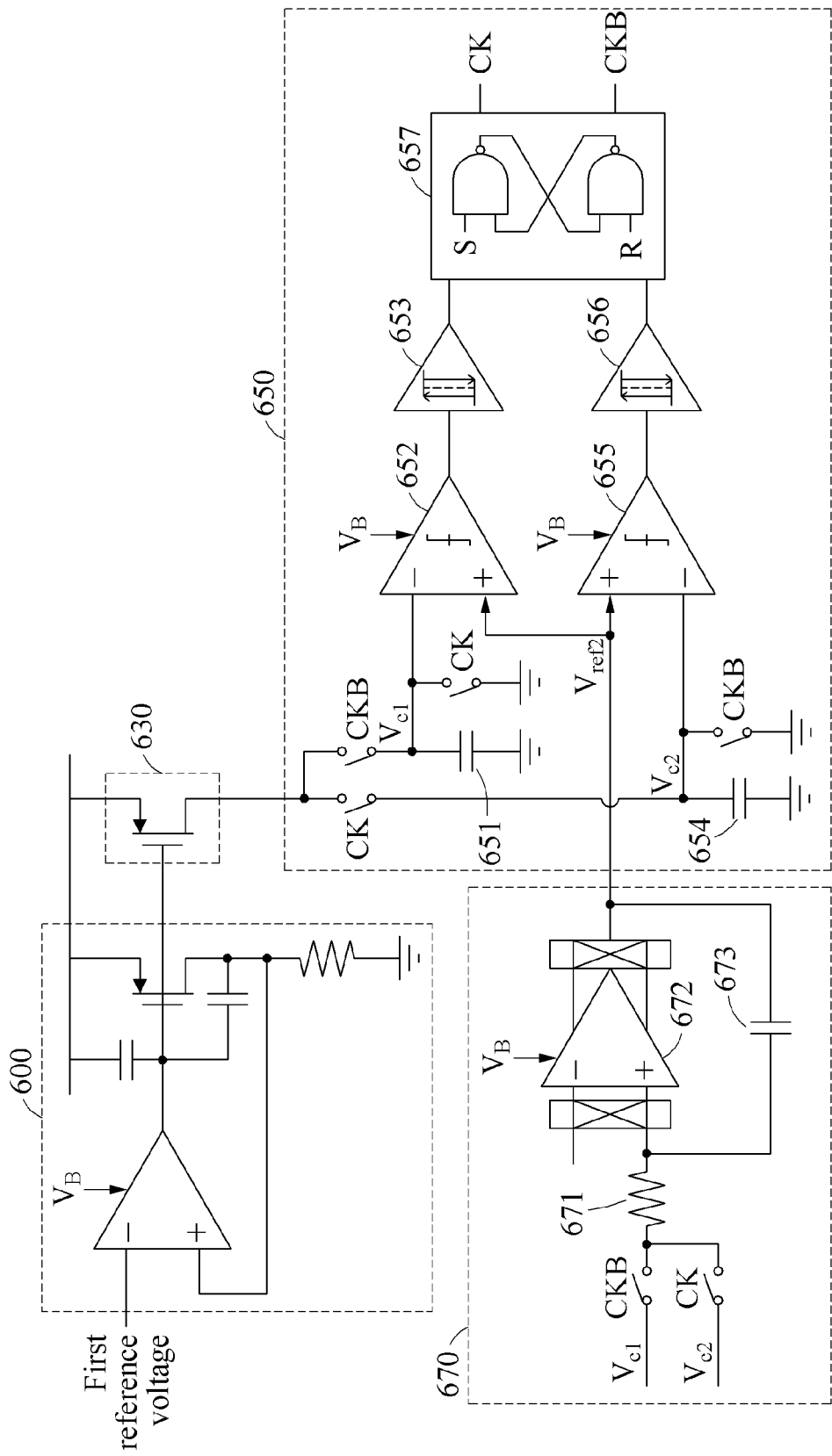
FIG. 6 illustrates an example of an oscillator including a feedback circuit.

FIG. 6 illustrates an example of an oscillator including a feedback circuit.

Referring to FIG. 6, an oscillator includes a constant current generator 600, a mirroring transistor 630, an oscillating element 650, and a feedback circuit 670. The oscillating element 650 may include two capacitors 651 and 654, two comparators 652 and 655, and a latch 657. The oscillating element 650 may further include two Schmitt triggers 653 and 656. The description provided with reference to FIGS. 1 through 5B is applicable to the constant current generator 600, the mirroring transistor 630, and the oscillating element 650, and thus duplicate description will be omitted here.

The feedback circuit 670 includes a feedback resistor 671, a feedback amplifier 672, and a feedback capacitor 673.

The feedback amplifier 672 receives one of a voltage of a first capacitor and a voltage of a second capacitor as a first input through a feedback resistor 671. One of the voltage of the first capacitor (Vc1) and the voltage of the second capacitor (Vc2) is selected to be input to the feedback amplifier 672 based on a clock signal. The feedback amplifier also receives a constant voltage to control a second reference voltage as a second input. The constant voltage to control the second reference voltage is a voltage (feedback input voltage) applied to the resistor R6 of FIG. 5B.

The feedback resistor 671 of the feedback circuit 670 is connected in series with the first input of the feedback amplifier 672. The feedback circuit 670 may include the feedback capacitor 673 connected between the first input of the feedback amplifier 672 and an output of the feedback amplifier 672.

Similar to controlling the output of the feedback circuit 570 of FIG. 5B to be substantially equal to the second reference voltage, an output of the feedback circuit 670 of FIG. 6 is, for example, the output of the feedback amplifier 672, is controlled to be substantially equal to the second reference voltage. The feedback circuit 670 constitutes a part of a feedback loop. The output of the feedback amplifier 672 goes through the feedback capacitor 673 and is input as the first input of the feedback amplifier 672 again.

The feedback amplifier 672 may be a chopper amplifier. The feedback circuit 670 through the chopper amplifier improves noise of the oscillating element 650. An internal transistor of the feedback amplifier 672 acts as a noise source. In an example in which the chopper amplifier is used, an operation of the amplifier is maintained the same, and flicker noise occurring in the internal transistor of the amplifier is removed. Further, the chopper amplifier periodically switches a positive input and a negative input and switches a positive output and a negative output, thereby removing a direct current (DC) offset and stably amplifying a DC signal.

The output of the feedback circuit 670 is used as the second reference voltage to be input into a positive terminal of the comparators 652 and 655 of the oscillating element 650. For example, the second reference voltage, which is the output of the feedback amplifier 672, is input into a positive terminal of the first comparator 652 and the second comparator 655 of the oscillating element 650. The first comparator 652 and the second comparator 655 may share the positive terminal.

The first input of the feedback circuit 670 is a voltage of a capacitor being charged in the oscillating element 650. For example, when a logical state of a first signal of the clock signal which is the output of the oscillating element 650 is "1", the lower capacitor of the oscillating element 650 is charged, and a voltage of the capacitor at that time is denoted as $V_{c2}$.

When the logical state of the first signal is "1", $V_{c2}$ is input as the first input of the feedback amplifier 672 by a switch through the feedback resistor 671. When a logical state of a second signal of the clock signal which is the output of the oscillating element 650 is "1", the upper capacitor of the oscillating element 650 is charged, and a voltage of the capacitor at that time is denoted as $V_{c1}$.

When the logical state of the second signal is "1", $V_{c1}$ is input as the first input of the feedback amplifier 672 by a switch through the feedback resistor 671.

The feedback circuit 670 may be a low-pass filter including a resistor and a capacitor. The feedback circuit 670 equalizes the two inputs of the feedback amplifier 672 through the feedback loop. For example, the feedback circuit 670 may have a feedback output that equalizes the first input of the feedback amplifier 672 with the feedback input voltage which is the second input. The feedback output is the second reference voltage.

The feedback circuit 670 receives the voltage to charge the capacitor as the first input and generates an output voltage such that a mean of the first input constantly corresponds to a voltage of the second input. The generated output voltage is supplied as the second reference voltage of the comparator. A change in a delay time is compensated for through the feedback circuit 670, whereby the frequency stability improves. The improvement in the frequency stability indicates that the frequency of the clock signal is maintained to be more constant.

Figure 7:
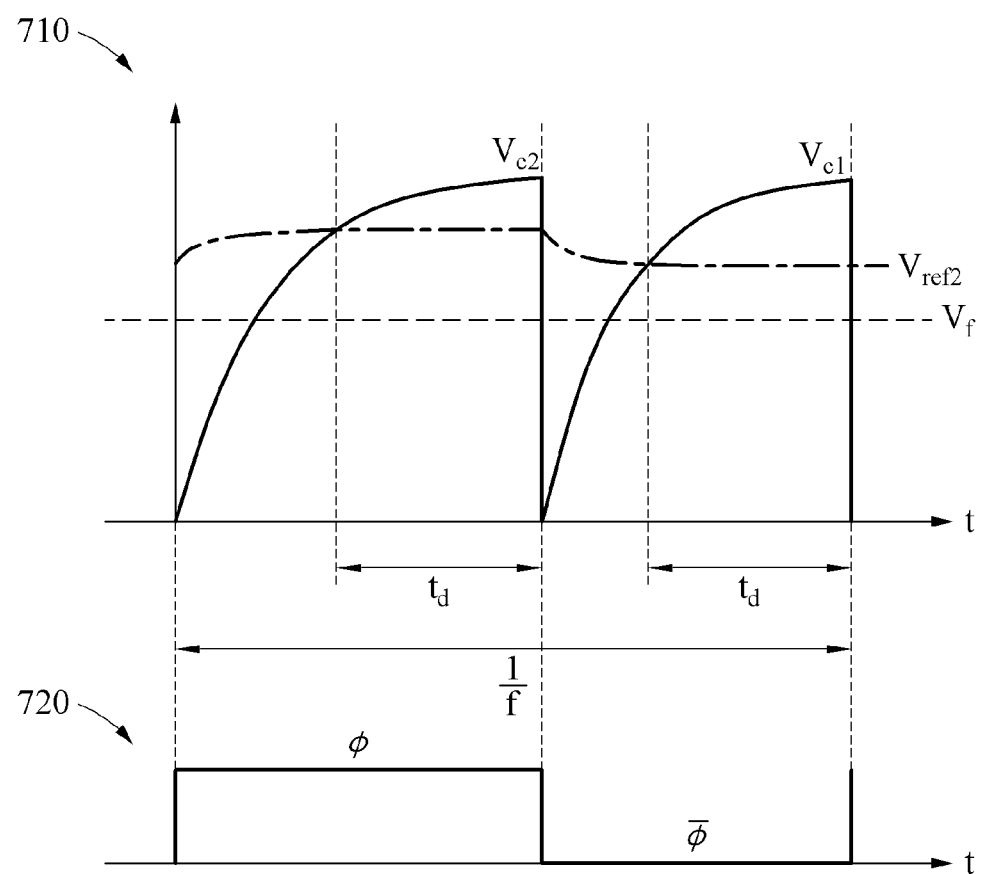
FIG. 7 illustrates an example of voltages of capacitors of an oscillating element and a frequency-compensated clock signal.

FIG. 7 illustrates an example of voltages of capacitors of an oscillating element and a frequency-compensated clock signal.

Referring to FIG. 7, a graph 710 shows a comparison of a voltage $V_{c1}$ of the first capacitor 651 and a voltage $V_{c2}$ of the second capacitor 654 of FIG. 6 to a second reference voltage $V_{ref2}$. The first comparator 652 compares the voltage $V_{c1}$ applied to both ends of the first capacitor 651 to the second reference voltage $V_{ref2}$. The second comparator 655 compares the voltage $V_{c2}$ applied to both ends of the second capacitor 654 to the second reference voltage $V_{ref2}$.

When a logical state of a first signal is "1", a voltage of 0 V is applied to the ends of the first capacitor 651, and a current mirrored from a constant current generated by a current generator flows in the second capacitor 654. Since the current flows at the ends of the second capacitor 654, the second capacitor 654 is charged. If the voltage $V_{c2}$ applied to the ends of the second capacitor 654 is less than the second reference voltage $V_{ref2}$, a logical state of a set input end of the latch 657 is "1", and a logical state of a reset input end of the latch 657 is "1". When the second capacitor 654 is charged, and the voltage $V_{c2}$ applied to the ends of the second capacitor 654 becomes greater than the second reference voltage $V_{ref2}$, a logical value of the reset input end of the latch 657 is changed to "0". In response to the change in the logical value of the reset input end of the latch 657, the logical state of the first signal is changed to "0". In an ideal example, the logical value of the reset input end is changed to "0" at an instant when $V_{c2}$ becomes greater than $V_{ref2}$. In an environment where a circuit operates in reality, a delay time td occurs at a comparator or a latch, and thus the change of the logical value is delayed for a time as much as td. In an example in which td is relatively long and inconstant, the frequency characteristic is unstable.

When the feedback circuit 670 is used, the delay time is compensated for and the frequency is maintained to be constant. The feedback circuit 670 receives the voltage to charge the capacitor as an input and supplies an output voltage as the second reference voltage of the comparator such that a mean of the input is constant. In detail, a feedback input voltage is denoted as $V_f$. Through a feedback loop of the feedback circuit 670, a feedback output that equalizes the mean of the voltage applied to both ends of the capacitor being charged with the feedback input voltage $V_f$ is provided. The foregoing operation is expressed by Equation 2.

$$\frac{1}{T}\int_0^T V_{c1,2}(t)dt = V_f \quad \text{Equation 2}$$

Equation 1 and Equation 2 are combined into an equation related to a cycle, as expressed by Equation 3.

$$\frac{1}{T}\int_0^T k\frac{V_{ref1}}{RC}t\,dt = \frac{kV_{ref1}}{2RC}T = V_f \quad \text{Equation 3}$$

$$T = \frac{2RCV_f}{kV_{ref1}} = \alpha\frac{2RC}{k}$$

In this example, $\alpha = V_f/V_{ref1}$. Referring to FIG. 5B, $$V_f = \frac{R3}{R1+R2+R3}V \text{ and } V_{ref1} = \frac{(R2+R3)}{R1+R2+R3}V$$

are satisfied. $\alpha$ is simply expressed as Equation 4.

$$\alpha = \frac{R3}{R2+R3} \quad \text{Equation 4}$$

Referring to Equations 3 and 4, a cycle of the clock signal is determined based on a product of the resistor of the current generator 600 and the capacitor of the oscillating element 650 and a resistor of a reference voltage dividing circuit. Since a value of $V_{ref2}$ is adjusted through the feedback circuit 670 to satisfy Equation 2, the delay time td has no effect on the cycle of the clock signal. For example, when the delay time td decreases, $V_{ref2}$ increases to maintain the same frequency through the feedback circuit 670. When the delay time td increases, $V_{ref2}$ decreases to maintain the same frequency through the feedback circuit 670.

Referring to FIG. 7, a graph 720 shows a frequency-compensated clock signal. The clock signal of the graph 720 maintains a predetermined frequency by being frequency-compensated through the feedback circuit 670. Although an oscillator may achieve frequency compensation through the feedback circuit 670, the cycle of the clock signal may be affected by the resistor of the current generator 600 and the resistor of the reference voltage dividing circuit. Thus, if the resistors are affected by a change in temperature, the frequency fluctuates. Temperature compensation may maintain the frequency to be more constant, which will be described in detail with reference to FIG. 10.

Figure 8:
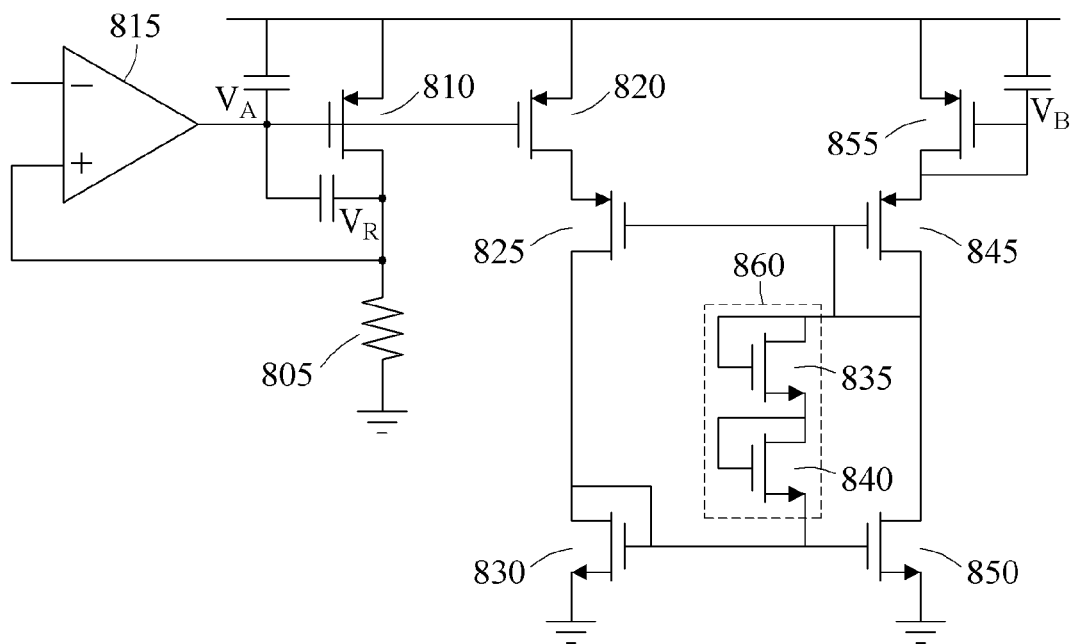
FIG. 8 illustrates an example of an initial bias supply circuit.

FIG. 8 illustrates an example of an initial bias supply circuit.

An oscillator may include an amplifier 815, a transistor 810, and a resistor 805 as elements of a constant current generator. As described above, the constant current generator generates a constant current using a feedback loop of the amplifier 815. To operate the feedback loop, an initial bias is supplied to the amplifier 815.

An initial bias current is supplied to the amplifier 815 of the constant current generator using an initial bias supply circuit. If the amplifier 815 of the constant current generator generates the constant current using the initial bias current, the initial bias supply circuit does not operate automatically. Accordingly, the amplifier 815 of the constant current generator is supplied with the bias current based on the autonomously generated constant current.

The initial bias supply circuit may include a first mirroring circuit, a second mirroring circuit, and a control circuit. The first mirroring circuit may include a mirroring transistor 820, a PMOS transistor 825, and an NMOS transistor 830, and the second mirroring circuit may include a mirroring transistor 855, a PMOS transistor 845, and an NMOS transistor 850. The control circuit is also referred to as a current pass transistor element 860.

Gates of the two PMOS transistors 825 and 845 are connected to each other, and gates of the two NMOS transistors 830 and 850 are connected to each other. The gate of the PMOS transistor 845 and a drain of the PMOS transistor 845 are connected to each other, and the gate of the NMOS transistor 830 and a drain of the NMOS transistor 830 are connected to each other. When the current pass transistor element 860 does not operate, the second mirroring circuit copies a current that flows in the first mirroring circuit.

The current pass transistor element 860 is connected between the gates of the PMOS transistors 825 and 845 and the gates of the NMOS transistors 830 and 850. The current pass transistor element 860 may include two transistors 835 and 840. A gate and a drain of each of the two transistors 835 and 840 of the current pass transistor element 860 are connected to each other, and a source of the transistor 835 is connected to the drain of the transistor 840.

Since a bias current is not supplied to the amplifier 815 from an external device, an initial bias current is supplied using an initial bias supply circuit for start-up of the amplifier 815.

For example, when a power source is supplied to an oscillator, the two transistors 835 and 840 of the current pass transistor element 860 operate by a difference between a common gate voltage of the PMOS transistors 825 and 845 and a common gate voltage of the NMOS transistors 830 and 850. When the transistors 835 and 840 of the current pass transistor element 860 operate, a current path from the PMOS transistor 845 through the two transistors 835 and 840 of the current pass transistor element 860 to the NMOS transistor 830 is created. A current that flows along the current path is referred to as a start-up current.

When the start-up current flows, a voltage for the initial bias current is generated at the gate of the mirroring transistor 855, and the initial bias current is provided to the amplifier 815.

When the amplifier 815 operates using the current generated by the initial bias supply circuit, a constant-current flow in the resistor 805 through the feedback loop. When the constant current flows in the resistor 805, the current is supplied to the initial bias supply circuit through the mirroring transistor 820 and the transistor 810 of the constant current generator. When the current is supplied to the initial bias supply circuit, the common gate voltage of the PMOS transistors 825 and 845 decreases, and the common gate voltage of the NMOS transistors 830 and 850 increases. In this example, the difference between the common gate voltage of the PMOS transistors 825 and 845 and the common gate voltage of the NMOS transistors 830 and 850 decreases such that the current pass transistor element 860 may not operate. When a stable constant-current flows in the resistor 805 in response to the operation of the amplifier 815, the start-up current does not flow therein, and the two transistors 835 and 840 of the current pass transistor element 860 are turned off. An output voltage of the amplifier 815 is denoted as $V_A$, a gate voltage of the mirroring transistor 855 is denoted as $V_B$, and a voltage applied to the resistor 805 is denoted as $V_R$. When the start-up current flows by the difference between the common gate voltage of the PMOS transistors 825 and 845 and the common gate voltage of the NMOS transistors 830 and 850, $V_B$ decreases first. When the amplifier 815 operates using the start-up current generated by the initial bias supply circuit, the current should be supplied to the resistor 805 through the feedback loop, and thus $V_A$ also decreases. The circuit of FIG. 8 is a mirroring circuit using the mirroring transistor 820 and the transistor 810 of the constant current generator. Thus, $V_A$ and $V_B$ are equalized such that the constant current that flows in the resistor 805 and the start-up current are equalized. An aspect of $V_A$ and $V_B$ changing over time at an initial operation will be described with reference to FIG. 9.

Figure 9:
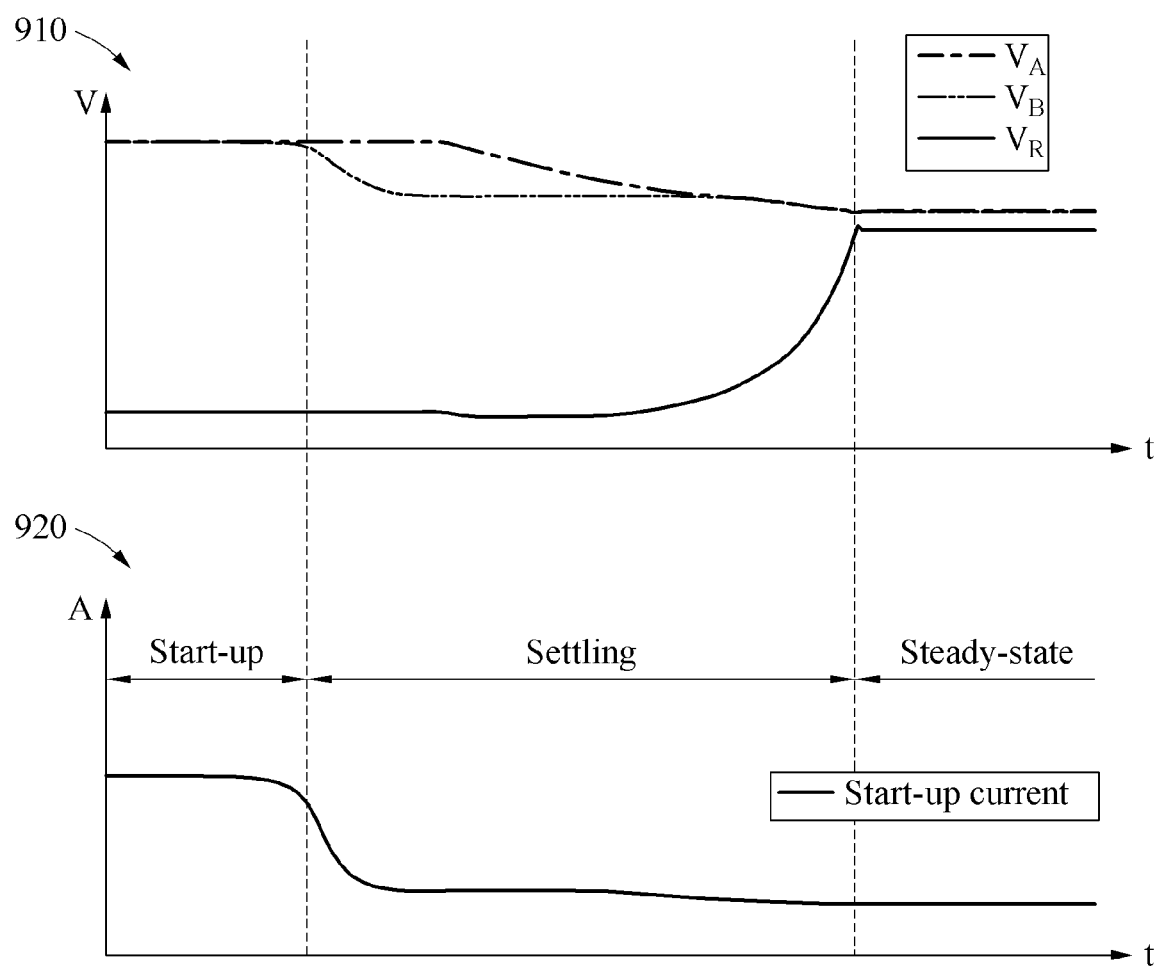
FIG. 9 is a graph illustrating an example of voltages and a current of an initial bias supply circuit.

FIG. 9 is a graph illustrating an example of voltages and a current of an initial bias supply circuit.

Referring to graph 910, $V_B$ decreases first in a settling period, and $V_A$ decreases subsequently such that the two values are equalized in a steady-state period. As $V_A$ and $V_B$ decrease and are equalized, a feedback loop operates. In response to the operation of the feedback loop, $V_R$ which is a voltage applied to the resistor 805 increases gradually. As $V_R$ increases gradually, $V_{ref1}$ is equalized in the steady-state period.

Referring to graph 920 in FIG. 9, a start-up current decreases gradually in the settling period, and a current does not flow or has a value as diminutive as a leakage current in the steady-state period. After the steady-state period, a bias current is autonomously generated and used although a bias is not supplied from an external device.

Figure 10:
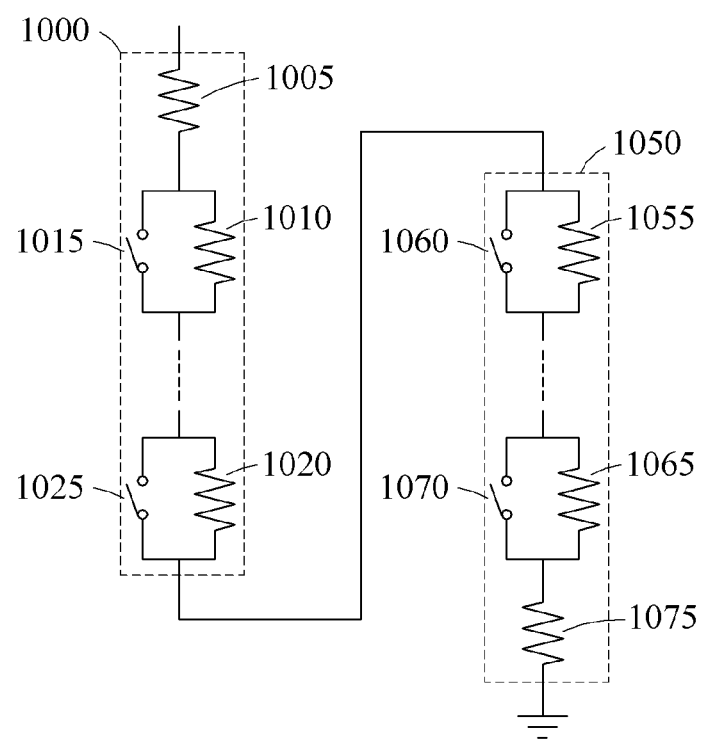
FIG. 10 illustrates an example of a temperature compensation resistor.

FIG. 10 illustrates an example of a temperature compensation resistor.

A resistor of a constant current generator is a temperature compensation resistor as illustrated in FIG. 10. The resistor of the constant current generator occupies a largest area in the entire circuit of an oscillator. By precisely designing and controlling the resistor of the constant current generator, a temperature coefficient is controlled in a wide region.

A resistance value changes in response to a change in temperature, and a rate of the change in the resistance is referred to as a temperature compensation coefficient. In an example in which the resistance increases as the temperature increases, the temperature compensation coefficient is a positive number. Conversely, in an example in which the resistance decreases as the temperature increases, the temperature compensation coefficient is a negative number.

Referring to FIG. 10, the temperature compensation resistor includes resistors 1000 with positive temperature compensation coefficients and resistors 1050 with negative temperature compensation coefficients. The resistors with the positive temperature compensation coefficients are p-poly resistors. The resistors with the negative temperature compensation coefficients are n-poly resistors.

The resistors 1000 with the positive temperature compensation coefficients may include a resistor 1005 which always operates, and resistors 1010 and 1020 which do not operate when switches 1015 and 1025 are closed and operate only when the switches 1015 and 1025 are opened. The resistors 1050 with the negative temperature compensation coefficients may include a resistor 1075 that always operates, and resistors 1055 and 1065 that do not operate when switches 1060 and 1070 are closed and operate only when the switches 1060 and 1070 are opened. The resistors 1000 with the positive temperature compensation coefficients and the resistors 1050 with the negative temperature compensation coefficients are connected in series.

When the resistors 1000 with the positive temperature compensation coefficients and the resistors 1050 with the negative temperature compensation coefficients are controlled in the same direction, a current that flows in a resistor is scaled by controlling the resistor itself. When the resistors 1000 with the positive temperature compensation coefficients and the resistors 1050 with the negative temperature compensation coefficients are controlled in different directions, the temperature coefficient is controlled.

A current that flows in a resistor of a constant current generator is mirrored and used to charge a capacitor of an oscillating element or used as a bias current of a comparator or an amplifier. When the temperature increases, a delay time td typically increases. For example, although a current of the same size is applied to the comparator, the delay time by the comparator increases further when the temperature is relatively high. When the delay time increases, a frequency of a clock signal is lowered.

To compensate for the lowered frequency of the clock signal, the resistors 1000 with the positive temperature compensation coefficients or the resistors 1050 with the negative temperature compensation coefficients are controlled. In an example in which the resistors 1050 with the negative temperature compensation coefficients are used, an overall resistance decreases when the temperature increases. When the overall resistance decreases, a value of the current that flows in the resistor increases. The current that flows in the resistor is mirrored and used as a bias current of the comparator. The bias current to be input into the comparator also increases as the temperature increases, and a delay time is reduced by increasing the bias current. In response to the increase in temperature by increasing the bias current to be input into the comparator, a bandwidth of the comparator decreases and a time increased as much as the delay time is compensated for. A change in the delay time of the comparator with respect to the temperature and a temperature coefficient of a resistive current are offset, and thus the frequency of the clock signal is controlled to be constant with respect to the temperature.

The resistors 1000 with the positive temperature compensation coefficients and the resistors 1050 with the negative temperature compensation coefficients are controlled more precisely using the respective switches 1015, 1025 and 1060, 1070. For example, the resistors 1000 with the positive temperature compensation coefficients have resistances which greatly change in a control operation, and the resistors 1050 with the negative temperature compensation coefficients have temperature compensation coefficients which greatly change in the control operation. In the control operation, the temperature coefficient may be compensated by setting the resistors 1000 with the positive temperature compensation coefficients to have resistances close to a target resistance and frequencies close to a target frequency and controlling the resistors 1050 with the negative temperature compensation coefficients. In a process of controlling the resistors 1050 with the negative temperature compensation coefficients, the resistances thereof may change. The frequency is corrected one more time through a first reference voltage and a capacitance, without changing the temperature coefficient.

Figure 11:
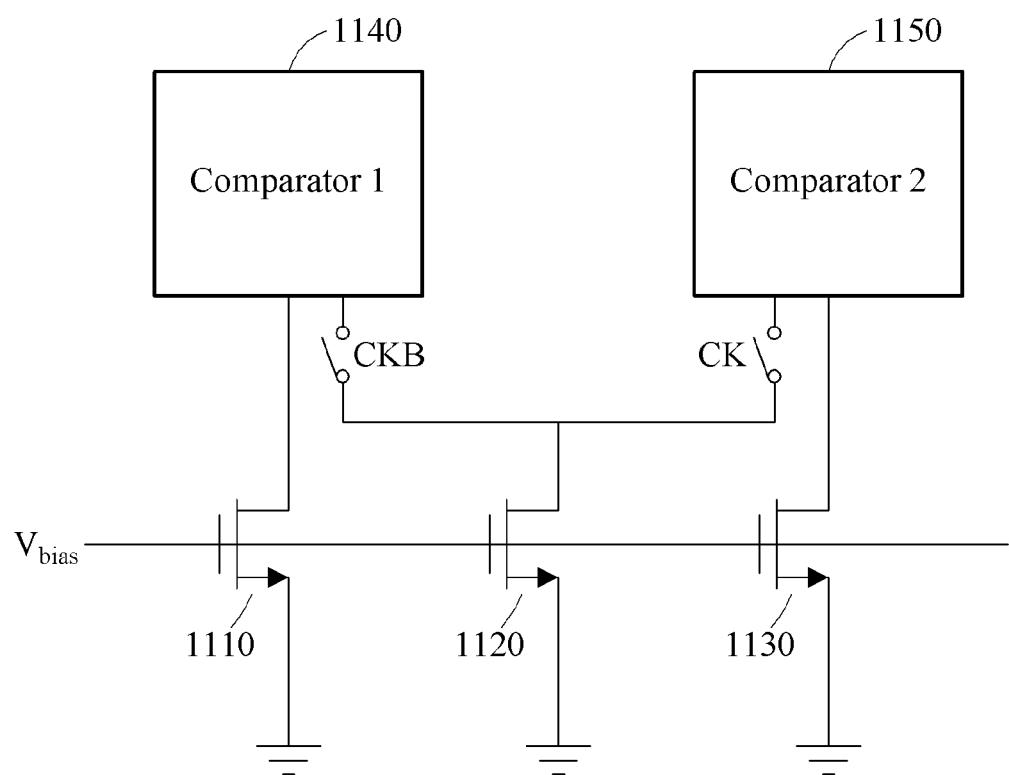
FIG. 11 illustrates an example of a switch bias circuit controlling two comparators to increase a power efficiency.

FIG. 11 illustrates an example of a method of controlling two comparators using a switch bias circuit to increase a power efficiency.

An oscillating element uses two comparators. In an example, the two comparators may have a structure in which the comparators operate in an alternate manner, rather than operating concurrently. For example, when the first comparator 652 of FIG. 6 operates, the second comparator 655 may not need to operate. Conversely, when the second comparator 655 operates, the first comparator 652 may not need to operate. If a comparator which does not need to operate is turned off, a transistor in the comparator may be resettled until the comparator is turned on again. Thus, it may be necessary to maintain the comparator which may not need to operate to be turned on. Since the comparator which does not need to operate is maintained to be turned on, there is a power consumption. An example in which a comparator needs to operate is referred to as being in an operating region, and an example in which a comparator does not need to operate is referred to as being in a non-operating region.

Referring to FIG. 11, a switch bias circuit controls a comparator of a non-operating region to be in a low power mode. The switch bias circuit may include a first transistor 1110 connected to a first comparator 1140, a second transistor 1130 connected to a second comparator 1150, and a third transistor 1120 connected to switches which are controlled based on a clock signal. Gates of the first transistor 1110, the second transistor 1130 and the third transistor 1120 are connected to a bias voltage. The bias voltage is transmitted by a mirroring circuit.

A determination of whether a comparator is in an operating region is based on the clock signal. For example, the first comparator 1140 is in an operating region when a first signal of the clock signal is "1", and the second comparator 1150 is in an operating region when a second signal of the clock signal is "1".

A comparator of a non-operating region is set to be in a low power mode. In the low power mode, the third transistor 1120 may not supply a current, and a current is supplied only by the transistor connected to each comparator. In the low power mode, to minimize a power consumption, the transistors 1110 and 1130 connected to the comparators supply minimal currents that maintain a threshold voltage Vth of the transistors in the comparators. For example, when the first signal of the clock signal is "1", the second comparator 1150 is in an operating region, and the first comparator 1140 is in a non-operating region. The third transistor 1120 supplies a current only to the second comparator 1150 in the operating region. The second comparator 1150 in the operating region is supplied with the current from the second transistor 1130 and the third transistor 1120. The first comparator 1140 in the non-operating region operates in a low power mode. In the low power mode, the first comparator 1140 is supplied with the current only from the first transistor 1110, and the current is a minimal current that maintains the threshold voltage $V_{th}$ of the transistors in the first comparator 1140.

By adjusting parameters of the first transistor 1110, the second transistors 1130, and the third transistor 1120, a magnitude of the current supplied from each transistor to the comparator is controlled. The first transistor 1110 and the second transistors 1130 which always supply currents to the comparators each supply a less amount of current than the third transistor 1120 which selectively supplies a current to the comparators. For example, a ratio of the currents supplied from the respective transistors is 1:5:1. The ratio of the supplied currents is controlled by a user. The first transistor 1110 and the second transistors 1130 supply the same amount of currents.

In an example in which the switch bias circuit is not used, a comparator of the non-operating region also has the same power consumption as a comparator in the operating region. In an example in which the switch bias circuit is used, a delay time and a bandwidth are the same as those in the example in which the switch bias circuit is not used, and a power efficiency may increase.

For example, if the ratio of the currents supplied from the respective transistors is 1:5:1, a current corresponding to "6" is supplied to each comparator. In an example in which the switch bias circuit is not used, a comparator of the non-operating region also has the same power consumption as a comparator in the operating region, and thus a power corresponding to "12" is consumed. In the example in which the switch bias circuit is used, a comparator operating in the low power mode consumes a power corresponding to "1", and a comparator in the operating region consumes a power corresponding to "6", and thus a power corresponding to "7" in total is consumed. Hence, in the example in which the switch bias circuit is used, the comparators operate using currents of about 58% while having the same delay time and bandwidth, when compared to the example in which the switch bias circuit is not used.

Figure 12:
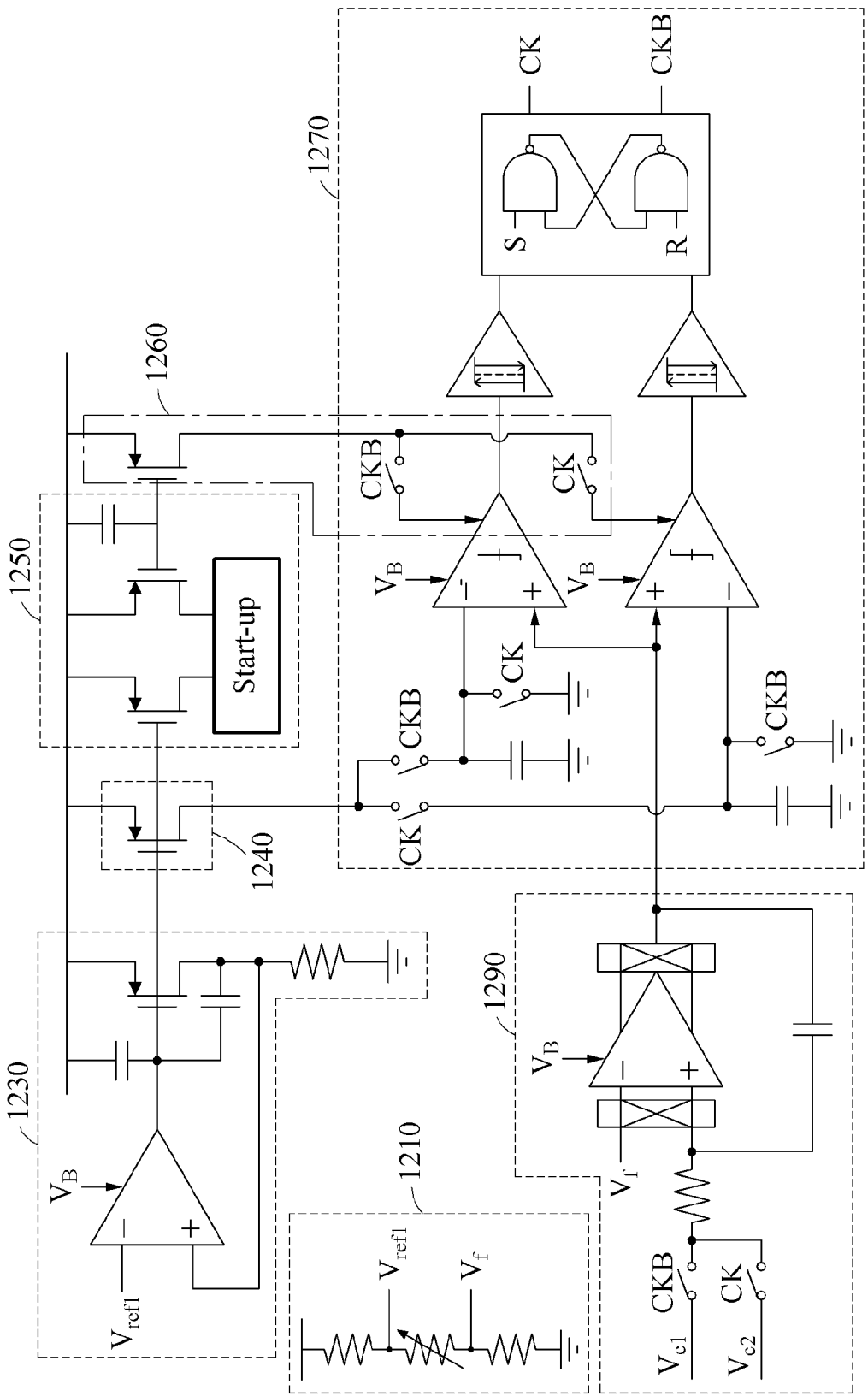
FIG. 12 illustrates an example of a circuit diagram of an oscillator.

FIG. 12 illustrates an example of a circuit diagram of an oscillator.

Referring to FIG. 12, an oscillator may include a power source element 1210, a constant current generator 1230, a mirroring transistor 1240, an initial bias supply circuit 1250, a switch bias circuit 1260, an oscillating element 1270, and a feedback circuit 1290.

The power source element 1210 corresponds to the reference voltage dividing circuit of FIG. 5B. A supplied voltage may be a constant voltage. By adjusting a value of a variable resistor of the power source element 1210, a frequency of a circuit is controlled. A voltage divided from the power source element 1210 is supplied to the constant current generator 1230 and the feedback circuit 1290.

The constant current generator 1230 corresponds to the constant current generator of FIG. 2A or 2B. The constant current generator 1230 generates a constant current in a resistor by forming a feedback loop. The generated constant current is mirrored and used in the oscillator. For example, the current is used as a bias current to operate an amplifier or a comparator or used to charge a capacitor of the oscillating element 1270. The resistor of the constant current generator 1230 is the temperature compensation resistor of FIG. 10. By increasing the bias current to be input into the comparator using the temperature compensation resistor, a delay time increased as a bandwidth of the comparator decreases in response to the increase in the temperature may be compensated.

The mirroring transistor 1240 corresponds to the mirroring transistor of FIG. 3. The mirroring transistor 1240 mirrors the current generated by the constant current generator 1230 and supplies the mirrored current to the oscillating element 1270. In addition to the mirroring transistor 1240 in the circuit diagram of FIG. 12, a plurality of mirroring transistors may be implemented to supply the bias current to the comparator and the amplifier in the oscillator. For example, $V_B$ is illustrated above the comparator and the amplifier of the circuit of FIG. 12. $V_B$ is the bias voltage supplied through a mirroring transistor omitted from the circuit diagram.

The initial bias supply circuit 1250 corresponds to the initial bias supply circuit of FIG. 8. The initial bias supply circuit 1250 supplies the bias current until the constant current generator 1230 operates in a steady state.

The oscillating element 1270 corresponds to the oscillating element of FIG. 4A or FIG. 4B. The oscillating element 1270 charges the capacitor by mirroring the constant current generated by the constant current generator 1230 and generates a clock signal by comparing a voltage of the charged capacitor to a second reference voltage. A charge and discharge cycle of the capacitor is controlled based on the clock signal.

The switch bias circuit 1260 corresponds to the switch bias circuit of FIG. 11. The switch bias circuit 1260 controls the bias current supplied to the comparator existing in the oscillating element 1270, thereby increasing the power efficiency. The switch bias circuit 1260 configures a dual bias of the comparator, which is divided into a fixed bias that maintains the comparator to be turned on and a bias that is switched to extend the bandwidth of the comparator by supplying the current only during a period in which the comparator operates, thereby maintaining the same bandwidth while reducing the power consumption of the comparator.

The feedback circuit 1290 corresponds to the feedback circuit of FIG. 6. The feedback circuit 1290 receives a voltage to charge the capacitor as an input and supplies an output voltage as a second reference voltage of the comparator such that a mean of the input is constant. By compensating for a change in the delay time which may substantially affect a stability of the frequency in an existing structure through the feedback circuit 1290, the frequency is maintained to be more constant.

The oscillators, devices, and other components described herein with respect to FIGS. 1-6, 8, and 10-12 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computers using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An oscillator, comprising:
a constant current generator configured to generate a constant current by maintaining a predetermined potential difference between a first end of a resistor of the constant current generator and a second end of the resistor; and
an oscillating element configured to output a clock signal corresponding to a charge and discharge cycle of one or more of a first capacitor and a second capacitor of the oscillating element based on a bias current corresponding to the generated constant current,
wherein the constant current generator comprises:
the resistor; and
a feedback loop configured to maintain a voltage to be applied to the resistor to be a first reference voltage,
wherein the feedback loop comprises:
an amplifier configured to receive the first reference voltage and a voltage to be applied to the first end of the resistor; and
a transistor configured to receive an output of the amplifier as a gate voltage and control the voltage to be applied to the first end of the resistor, and
wherein the constant current generator further comprises:
a capacitor connected between an output end of the amplifier and a source of the transistor.

2. The oscillator of claim 1, wherein the resistor comprises:
a first resistor which has a positive temperature coefficient; and
a second resistor which has a negative temperature coefficient,
wherein the first resistor and the second resistor are variable resistors.

3. The oscillator of claim 2, wherein the constant current is scaled by adjusting magnitudes of the first resistor and magnitudes of the second resistor, and
a temperature-dependent characteristic of a frequency of the clock signal is compensated for based on a ratio of the first resistor to the second resistor.

4. The oscillator of claim 2, wherein magnitudes of the first resistor and magnitudes of the second resistor and a ratio of the first resistor to the second resistor are controlled through operation of switches respectively connected in parallel with the first resistor and the second resistor.

5. The oscillator of claim 1, wherein the constant current generator further comprises:
a capacitor connected between an output end of the amplifier and a drain of the transistor.

6. The oscillator of claim 1, further comprising:
a mirroring element configured to mirror the generated constant current,
wherein the bias current is generated based on the mirrored constant current.

7. The oscillator of claim 1, wherein the clock signal comprises a first signal and a second signal which have exclusive logical values.

8. The oscillator of claim 1, wherein the oscillating element comprises:
the capacitor; and
a comparator configured to compare a voltage of the capacitor to a reference voltage.

9. The oscillator of claim 8, further comprising:
a mirroring element configured to mirror the generated constant current,
wherein the comparator is configured to operate based on the mirrored constant current.

10. The oscillator of claim 1, wherein the oscillating element further comprises:
a switch element configured to control the charge and discharge cycle of the capacitor based on the clock signal.

11. The oscillator of claim 1, wherein the constant current generator further comprises:
an initial bias supply circuit configured to supply an initial bias current to operate an amplifier included in the feedback loop.

12. The oscillator of claim 11, wherein the initial bias supply circuit comprises:
a first mirroring circuit configured to mirror the generated constant current;

a second mirroring circuit configured to mirror the mirrored constant current; and a control circuit configured to generate a current path between the first mirroring circuit and the second mirroring circuit such that the initial bias current is generated by the second mirroring circuit until the feedback loop reaches a steady state.

13. The oscillator of claim 1, wherein the clock signal includes a first signal and a second signal which have exclusive logical values, and wherein the oscillating element comprises:

the first capacitor, which is configured to be charged based on the second signal;

the second capacitor, which is configured to be charged based on the first signal;

a first comparator configured to compare a voltage of the first capacitor to a reference voltage; and a second comparator configured to compare a voltage of the second capacitor to the reference voltage.

14. The oscillator of claim 13, wherein the oscillating element further comprises:

a feedback circuit configured to control the reference voltage such that a mean of the voltage of the first capacitor and the voltage of the second capacitor is constant.

15. The oscillator of claim 13, further comprising:

a latch, wherein the latch comprises:

a set input end connected to an output end of the first comparator;

a reset input end connected to an output end of the second comparator;

a positive output end configured to output the first signal; and a negative output end configured to output the second signal.

16. The oscillator of claim 14, wherein the feedback circuit comprises:

a feedback amplifier configured to receive one of the voltage of the first capacitor and the voltage of the second capacitor as a first input through a feedback resistor, wherein the one of the voltage of the first capacitor and the voltage of the second capacitor is selected based on the clock signal, and the feedback amplifier is further configured to receive a constant voltage to control the reference voltage as a second input; and a feedback capacitor connected between the first input and an output of the feedback amplifier.

17. The oscillator of claim 13, further comprising:

a first transistor configured to supply an operating current to the first comparator;

a second transistor configured to supply an operating current to the second comparator; and a third transistor configured to additionally supply an operating current to one of the first comparator and the second comparator, based on the clock signal.

18. An oscillator comprising:

a constant current generator configured to generate a constant current in a resistor based on a feedback loop; and an oscillating element configured to charge a capacitor of the oscillating element by mirroring the generated constant current, and generate a clock signal by comparing a voltage of the charged capacitor and a reference voltage, wherein the feedback loop comprises:

an amplifier configured to receive the first reference voltage and a voltage to be applied to the first end of the resistor; and a transistor configured to receive an output of the amplifier as a gate voltage and control the voltage to be applied to the first end of the resistor, and wherein the constant current generator further comprises:

a capacitor connected between an output end of the amplifier and a source of the transistor.

19. The oscillator of claim 18, further comprising a control circuit configured to control a charge and discharge of the capacitor based on the clock signal.

20. The oscillator of claim 18, further comprising an initial bias supply circuit configured to supply a bias current until the constant current generator operates in a steady state.

* * * * *